ANALOG MULTIPLIER, DIVIDER, VARIABLE GAIN ELEMENT

Filed Feb. 9, 1968

INVENTORS
FREDERICK BUCKLEY
LAWRENCE P. FITZGERALD
BY John C. Black
ATTORNEY 3,500,032

ANALOG MULTIPLIER, DIVIDER, VARIABLE GAIN ELEMENT

Frederick Buckley, Vestal, N.Y., and Lawrence P. Fitzgerald, Warrenton, Va., assignors to International Business Machines Corporation, Armonk, N.Y., a corporation of New York Filed Feb. 9, 1968, Ser. No. 704,457
Int. Cl. G06g *7/16*
U.S. Cl. 235—195 9 Claims

ABSTRACT OF THE DISCLOSURE

A circuit arrangement particularly adapted for fabrication by common monolithic techniques alternatively provides the functions of multiplying, dividing or variable gain. A first pair of matched transistors have their base-collector electrodes short-circuited and their emitter electrodes connected to a first current source. One of the base electrodes is connected to a reference potential and the other base electrode is coupled to a second current source. A second pair of matched transistors have their emitter electrodes connected to a third current source. The base-collector electrodes of one of the latter transistors are short-circuited and connected to the reference potential, and the base electrode of the other latter transistor is connected to the second current source. Current flowing in the collector electrode of the other latter transistor is directly proportional to the second and third current source levels and inversely proportional to the first current source level.

BACKGROUND OF THE INVENTION

Field of the invention

The improved circuit of the present application is particularly useful in analog applications in the field of control systems, analog computers and hybrid digital-analog applications such as character recognition and the like and general AGC (Automatic Gain Control) applications. In most fields involving the electronic art, the trend in recent years has been toward miniaturization of the electrical apparatus. As this trend continues with greater intensity, the need for simplified, readily fabricated integrated circuits becomes more important.

It is, therefore, the primary object of the present invention to provide an extremely simplified semiconductor circuit which is particularly well adapted for monolithic fabrication in a semiconductor chip to perform the functions of multiplying, dividing and/or variable gain at very high speeds with good accuracy, dynamic range and low cost.

SUMMARY OF THE INVENTION

The above object is achieved in a preferred embodiment of the present application by providing a circuit arrangement particularly adapted for fabrication by common monolithic techniques, alternatively providing the functions of multiplying, dividing or variable gain. A first pair of matched transistors have their base-collector electrodes short-circuited and their emitter electrodes connected to a first source of current. One of the base electrodes is connected to a reference potential and the other base electrode is coupled to a second source of current. A second pair of matched transistors have their emitter electrodes connected to a third source of current and the base-collector electrodes of one of the latter transistors are short-circuited and connected to the reference potential. Base to second I source, collector to reference. Current flowing in the collector electrode of the other latter transistor is the second and third current levels and the first current.

In order to achieve the variable gain function, the first current source can be made a function of the amplitude of an input signal which is to be normalized; for example, a function of the peak amplitude of the incoming signals, the average value of the incoming signals or the like. Then, if the input signal is made the second or third current source level, the other being fixed, current flowing in the collector of the other latter transistor will be the normalized input signal.

Higher accuracy and dynamic range can be obtained by interposing a buffer in the form of a unity gain voltage amplifier between the second current source, the second pair of transistors.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
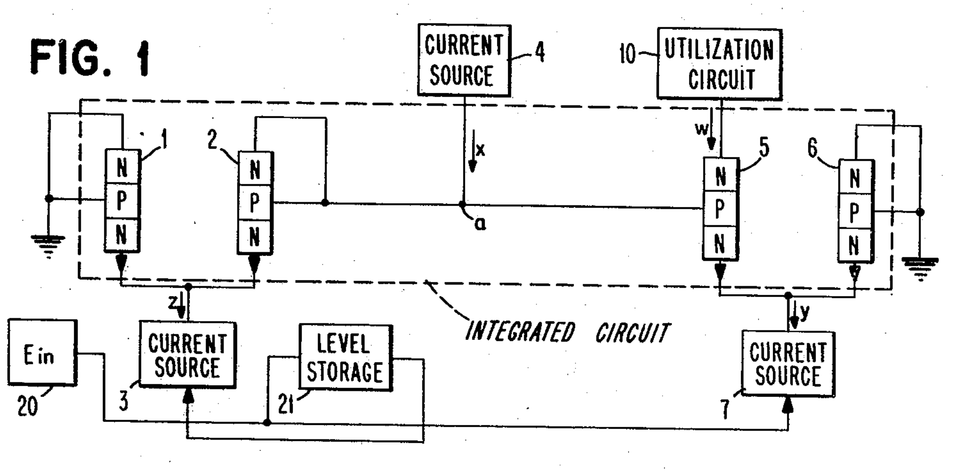
FIG. 1 is a circuit diagram of one preferred form of the improved circuit partially schematic and partially diagrammatic.

The improved circuit of FIG. 1 comprises a pair of transistors 1 and 2 having their base and collector electrodes short-circuited and having their emitter electrodes connected directly to a current source 3. The base and collector electrodes of the transistor 1 are connected to ground potential and the base and collector electrodes of the transistor 2 are connected to a current source 4.

A second pair of transistors 5 and 6 have their emitter electrodes connected directly to a third current source 7. The base and collector electrodes of the transistor 6 are connected to ground potential. The base electrode of the transistor 5 is connected to the current source 4, and its collector electrode is connected to a utilization circuit 10. For ease of explanation, the level and direction of currents flowing in the sources 3, 4 and 7 are identified by the reference letters $z$, $x$, $y$ respectively and their associated arrows. The level of the current which flows from the utilization circuit 10 is identified by the reference letter $w$.

Figure 2:
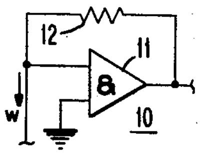
FIG. 2 is a fragmentary diagrammatic illustration of a suitable utilization circuit for the embodiment of FIG. 1.

A suitable utilization circuit 10 is illustrated in FIG. 2 and is in the form of an inverting amplifier 11 with shunt feedback 12.

In order to achieve suitable operation of the embodiment of FIG. 1, the transistors 1 and 2 must be fabricated so that their base-emitter voltage-current characteristics are matched as closely as possible. In addition, the transistors 5 and 6 should be fabricated so that their base-emitter voltage-current characteristics are matched.

Each of the transistors 1, 2, 5 and 6 must be operated in its linear region to achieve the desired results, that is, collector current varies linearly with base current.

For suitable operation, the base-collector electrodes of transistor 2 must be short-circuited by as low an impedance as possible, that is a metallization connection. Although it is preferred that the base-collector electrodes of the transistors 1 and 6 also be short-circuited by a metallization layer, nevertheless, suitable operation can be achieved so long as the impedance in the collector circuit is maintained at a reasonable low level and the collector voltage is at a reasonably low value with respect to ground. As the collector impedance increases, the speed of operation is necessarily decreased. As the collector voltage gets further from ground potential, the accuracy of the circuit de-generates because of differences in power dissipation in the transistors 1 and 2 as their collector voltages differ. Similarly, if the collector voltages of the transistors 5 and 6 differ significantly, then their power dissipations will correspondingly differ and the accuracy of the circuit de-generates. The utilization circuit 10 shown in greater detail in FIG. 2 provides a collector voltage for the transistor 5 which is very close to ground potential.

In order to achieve optimum accuracy, the pair of transistors 1 and 2 and the pair of transistors 5 and 6 should be thermally coupled as tightly as possible to maintain them at the same temperature.

In order to achieve suitable operation, the current $x$ must be substantially larger than the base current of transistor 5, otherwise accuracy de-generates to a point where it is intolerable. Also, the current level $z$ must exceed the current level $x$.

The operation of the embodiment of FIG. 1 is as follows: the current $x$ is substantially equal to the emitter current of the transistor 2, the base current of the transistor 5 being so small as to be neglected. The emitter current of the transistor 1 is equal to the difference between the current levels $z$ and $x$. With a constant current level $z$, an increase in the current level $x$ causes an increase in the emitter current and base-emitter voltage of the transistor 2 and a decrease in the emitter current and base-emitter voltage of transistor 1 which causes the voltage level at the base electrode of the transistor 2 to increase.

This increase in voltage at the base electrode of the transistor 2 will cause a corresponding increase in the output current level $w$. More particularly, the base electrode of the transistor 5 will be more positive forcing the base-emitter voltage of the transistor 5 to increase and the base-emitter voltage of the transistor 6 to decrease whereby a greater proportion of the current $y$ flows in the emitter of the transistor 5 and less of the current $y$ flows in the emitter of the transistor 6.

A better understanding of the operation of the embodiment of FIG. 1 is believed possible by reference to the equations and approximations set forth below. Reference is directed first to the base-emitter voltage-current equation:

$$v = V + e \ln i \qquad (1)$$

where:

$v$=the potential at the base electrode with respect to that emitter electrode;

$i$=the current flowing in the emitter electrode;

V=a constant equal to the base-emitter voltage when an emitter current of one unit is flowing ($i=1$);

$e$=a constant equal to the small signal resistance of the base-emitter diode at an emitter current of one unit; and ln represents the natural logarithmic function.

The voltage at the junction $a$ between the current source 4 and the base electrodes of the transistors 2 and 5 can be defined approximately as follows:

$$Va = -[V1 + e1 \ln(z-x)] + [V2 + e2 \ln(x)] = -[V6 + e6 \ln(y-w)] + [V5 + e5 \ln(w)] \qquad (2)$$

where the succeeding bracketed portions are the base-emitter voltage-current equations for each of the transistors 1, 2, 6 and 5 respectively. Since V1 equals V2 and V6 equals V5 because of the matched base-emitter voltage-current characteristics of the transistors 1 and 2 and 6 and 5, and since $e1$ equals $e2$ and $e6$ equals $e5$, Equation 2 can be reduced as follows:

$$\ln \frac{z-x}{x} = \ln \frac{y-w}{w} \qquad (3)$$

or $$w = \frac{xy}{z} \qquad (4)$$

Thus the circuit of FIG. 1 provides a multiply-divide function wherein the current level $w$ is a function of the products of the currents $x$ and $y$ divided by current level $z$. If the current level $z$ is maintained at some constant value, the circuit will act as a multiplier. If either of the currents $x$ or $y$ is maintained constant, the circuit acts as a divide circuit.

The improved circuit of FIG. 1 may be used for automatic gain control applications by connecting a source of input signals 20 to the current source 7 to cause the current $y$ to vary as a function of the instantaneous level of the input signals. The input signals are also coupled to a storage device 21 which causes the level $z$ of the current source 3 to be some function of the input signal; for example, a conventional capacitive storage circuit can store a voltage which is a function of the average amplitude of the input signals, the peak amplitude of the input signals or the like.

Assume that, for the intended application, the automatic gain control function is intended to cause the amplification of signals from the source 20 to vary inversely with the average amplitude of the signals. In such an application, the storage device 21 will store a voltage which is a direct function of the average amplitude of the input signals. This voltage will be transformed into the current source 3 to produce a current level $z$ which is a direct function of the voltage stored in the device 21. Since, as indicated above, the improved circuit of FIG. 1 produces an output current level $w$ equal to the product of currents $x$ and $y$ divided by the level of current $z$, the current $w$ is a function of $y$ divided by $z$. It is assumed that the level of the current $x$ does not vary. If the average amplitude of the signals increases, $z$ increases and the input signals are multiplied by a small number. Since the level $z$ varies directly with the average amplitude of the input signals, an automatic gain control function is provided.

Figure 3:
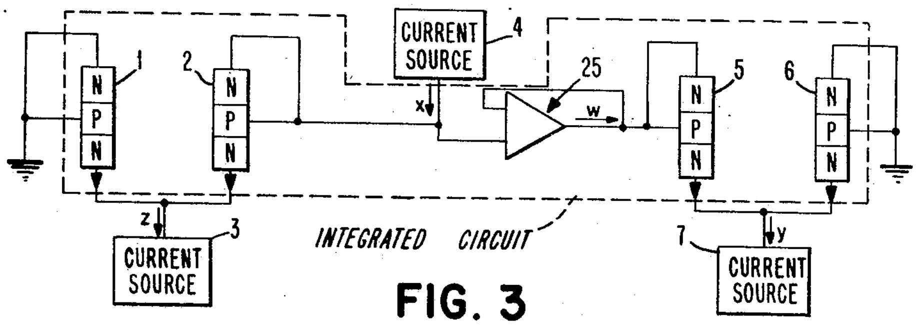
FIGS. 3 and 4 illustrate additional preferred forms of the improved circuit partially schematic and partially diagrammatic.

In applications where greater accuracy is required, a unity gain voltage amplifier such as 25 of FIG. 3 is interposed between the current source 4 and the transistor 5. In addition, the base-collector electrodes of the transistor 5 are short-circuited to each other. This buffer insures that substantially all of the current from the source 4 is directed into the base and collector electrodes of the transistor 2.

The remaining components in the embodiment of FIG. 3 are identical to those of FIG. 1 and operate in substantially the same manner.

Figure 4:
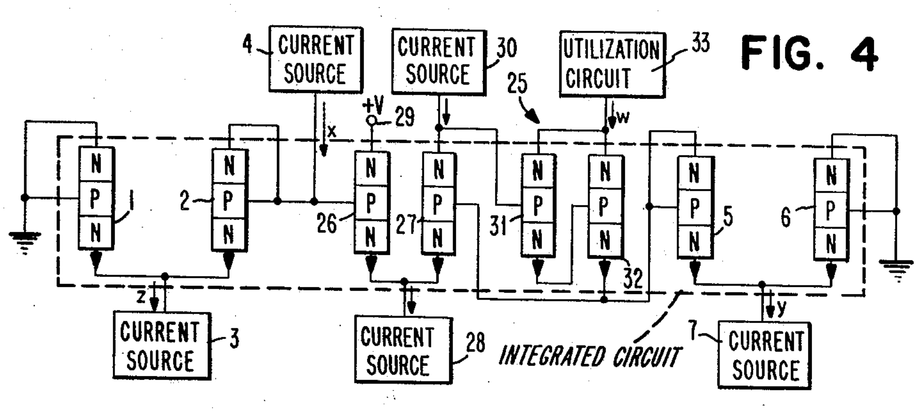

One preferred implementation of the circuit of FIG. 3 is illustrated in FIG. 4. Components in FIG. 4 which correspond to components in FIG. 1 are assigned the same reference numerals. Thus, FIG. 4 includes a first pair of transistors 1 and 2 coupled to a current source 3. A second pair of transistors 5 and 6 are coupled to a current source 7.

The unity gain voltage amplifier 25 comprises a first pair of transistors 26 and 27 having their emitter electrodes connected to a source of current 28. The base electrode of the transistor 26 is connected to the current source 4 and its collector electrode is coupled to a positive supply terminal 29. The collector electrode of the transistor 27 is connected to a current source 30 and to the base electrode of a transistor 31. The transistor 31 and a transistor 32 are connected as a Darlington pair emitter follower with their collector electrodes connected to a utilization circuit 33. Negative feedback for the buffer amplifier is provided by the direct connection between the emitter electrode of the transistor 32 and the base electrode of the transistor 27. The emitter electrode of the transistor 32 provides the output for the amplifier 25 and is connected to the short-circuited base and collector electrodes of the transistor 5.

The level of the current source 30 may be adjusted relative to the level of the current source 28 to compensate for any mismatching in the transistor pairs 1, 2 and 5, 6. The unity feedback characteristic of the amplifier 25 assures minimum current flow in the base electrode of the transistor 26, whereby substantially all of the current from the source 4 flows into the emitter electrode of the transistor 2 by way of its base and collector electrode connections. Hence, maximum accuracy is assured in the embodiment of FIG. 4.

Figure 5:
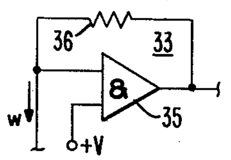
FIG. 5 is a fragmentary diagrammatic illustration of a suitable utilization circuit for use with the embodiment of FIG. 4.

One form of the utilization circuit 33 of FIG. 4 is illustrated in FIG. 5 as being in the form of an inverting amplifier 35 with negative feedback 36.

It will be appreciated that in each of the embodiments, PNP transistors can be utilized instead of NPN transistors in a manner well known in the art. Also, one pair of transistors can be of the NPN transistor type while the other pair is of the PNP type.

While the invention has been particularly shown and described with reference to preferred embodiments thereof, it will be understood that the foregoing and other changes in form and details may be made therein without departing from the spirit and scope of the invention.

We claim:

1. A circuit capable of multiplying and/or dividing comprising first and second transistors of a predetermined conductivity type having base, emitter and collector electrodes and having substantially matched base-emitter voltage-current characteristics, the collector and base electrodes of the second transistor being connected directly to each other and the emitter electrodes of the first and second transistors being connected directly to each other, third and fourth transistors of a predetermined conductivity type having substantially matched base-emitter voltage-current characteristics and having base, emitter and collector electrodes, their emitter electrodes being connected directly to each other;

means operating the transistors in their linear region;

a source of reference potential, the base electrodes of the first and fourth transistors being directly coupled to the source of reference potential, means providing a low impedance coupling between the base and collector electrodes of the first transistor and between the base and collector electrodes of the fourth transistor and maintaining the collector voltages of the first and fourth transistors close to said reference potential, a first source of current $x$, the base electrodes of the second and third transistors being coupled to the first source of current $x$, a second source of current $z$, the emitter electrodes of the first and second transistors being coupled to the second source of current $z$, a third source of current $y$, the emitter electrodes of the third and fourth transistors being coupled to the third source of current $y$, thereby producing in the collector electrode of the third transistor a current $w$ related to the first, second and third current sources substantially in accordance with equation:

$$w=\frac{xy}{z}$$

2. The circuit of claim 1 wherein the base and collector electrodes of the first transistor and those of the fourth transistor are connected directly to each other.

3. The circuit of claim 1 together with a unity gain voltage amplifier interposed between and coupling the first source of current to the base electrode of the third transistor, the base and collector electrodes of the third transistor being connected directly to each other.

4. The circuit of claim 2 together with a unity gain voltage amplifier interposed between and coupling the first source of current to the base electrode of the third transistor, the base and collector electrodes of the third transistor being connected directly to each other.

5. The circuit of claim 1 wherein the transistors are fabricated on a single semiconductor chip.

6. The circuit of claim 2 wherein the transistors are fabricated on a single semiconductor chip.

7. The circuit of claim 3 wherein the transistors are fabricated on a single semiconductor chip.

8. The circuit of claim 1 together with a source of input signals, means causing the level alternatively of the current $x$ or the current $y$ to be proportional to the instantaneous value of the input signals to reproduce the input signals in the current $w$, and means causing the level of the current $z$ to be proportional to some function of the input signal amplitude to vary the gain from current $y$ to current $w$.

9. The circuit of claim 2 together with a source of input signals, means causing the level alternatively of the current $x$ or the current $y$ to be proportional to the instantaneous value of the input signals to reproduce the input signals in the current $w$, means causing the level of the current $z$ to be proportional to some function of the input signal amplitude to vary the gain from current $y$ to current $w$.

References Cited

UNITED STATES PATENTS

| | | | |
|---|---|---|---|
| 2,973,146 | 2/1961 | Schmid | 235—194 |
| 3,304,419 | 2/1967 | Huntley et al. | 235—194 |
| 3,309,508 | 3/1967 | Witt | 235—194 X |
| 3,353,012 | 11/1967 | Baude | 235—194 |
| 3,423,578 | 1/1969 | Platzer et al. | 307—229 X |

MALCOLM A. MORRISON, Primary Examiner

J. F. RUGGIERO, Assistant Examiner

U.S. Cl. X.R.

235—194; 307—303